United States Patent
Zha et al.

(10) Patent No.: US 12,548,706 B2
(45) Date of Patent: Feb. 10, 2026

(54) MANUFACTURING METHODS OF A PLANAR TRANSFORMER

(71) Applicant: Apple Inc., Cupertino, CA (US)

(72) Inventors: Xiaoyue Zha, Shenzhen (CN); Guo Ouyang, Shenzhen (CN); Jingjing Ren, Shenzhen (CN); Prudhvi Mohan Maddineni, Santa Clara, CA (US); Vijay G. Phadke, San Jose, CA (US); Balal Khan, Guilford, CT (US)

(73) Assignee: Apple Inc., Cupertino, CA (US)

( * ) Notice: Subject to any disclaimer, the term of this patent is extended or adjusted under 35 U.S.C. 154(b) by 1105 days.

(21) Appl. No.: 17/540,256

(22) Filed: Dec. 2, 2021

(65) Prior Publication Data

US 2022/0093320 A1 Mar. 24, 2022

Related U.S. Application Data

(63) Continuation of application No. PCT/CN2019/115912, filed on Nov. 6, 2019.

(30) Foreign Application Priority Data

Jun. 3, 2019 (CN) .......................... 201910477789.2

(51) Int. Cl.
*H01F 41/02* (2006.01)
*H01F 27/24* (2006.01)
(Continued)

(52) U.S. Cl.
CPC ......... *H01F 27/2823* (2013.01); *H01F 27/24* (2013.01); *H01F 41/0206* (2013.01); *H05K 1/0213* (2013.01)

(58) Field of Classification Search
CPC .. H01F 27/2823; H01F 27/24; H01F 41/0206; H01F 27/2871; H01F 41/074;
(Continued)

(56) References Cited

U.S. PATENT DOCUMENTS 6,522,233 B1 2/2003 Kyoso et al.
6,665,931 B2 * 12/2003 Yamaguchi ............ H05K 3/103
29/601

(Continued)

FOREIGN PATENT DOCUMENTS

CN 203134536 U 8/2013
CN 207353061 U 5/2018
(Continued)

OTHER PUBLICATIONS

Office Action for Chinese Patent Application No. 2019104777892 dated Aug. 10, 2024; 6 pgs.

*Primary Examiner* — Donghai D Nguyen
(74) *Attorney, Agent, or Firm* — FLETCHER YODER PC

(57) ABSTRACT

Disclosed is a PCB of a planar transformer including: a PCB substrate with a through hole and a double-sided winding part formed on double sides of the PCB substrate, wherein the double-sided winding part is of a symmetric structure, a via hole consistent with the through hole is formed in the center of the double-sided winding part, the via hole is aligned to the through hole to form a magnetic core hole, and the circumference of the via hole is raised to form wire blocking parts; and forming a wire passing groove in the wall of the magnetic core hole, wherein the wire passing groove allows a metal conducting wire to pass through to be planarly wound from inside to outside on double sides of the double-sided winding part at the same time so as to form two coils in series located on the double sides of the PCB substrate.

20 Claims, 4 Drawing Sheets

(51) Int. Cl.
*H01F 27/28* (2006.01)
*H05K 1/02* (2006.01)

(58) Field of Classification Search
CPC .......... H01F 2027/2819; H01F 41/061; H05K 2201/09063; H05K 2201/09118; H05K 2201/1003; H05K 2201/10287; H05K 3/0014; Y10T 29/4902; Y10T 29/49071
See application file for complete search history.

(56) References Cited

U.S. PATENT DOCUMENTS

| | | | |
|---|---|---|---|
| 6,980,077 | B1 | 12/2005 | Chandrasekaran et al. |
| 7,414,507 | B2 * | 8/2008 | Giandalia ............. H01F 27/345 336/200 |
| 8,212,644 | B2 | 7/2012 | Young et al. |
| 2002/0159214 | A1 | 10/2002 | Perlick et al. |
| 2013/0207767 | A1 | 8/2013 | Worthington |
| 2014/0327509 | A1 | 11/2014 | Lacerda |
| 2015/0061805 | A1 | 3/2015 | Eom et al. |
| 2022/0093320 | A1 | 3/2022 | Zha et al. |
| 2023/0368961 | A1 | 11/2023 | Khan et al. |
| 2023/0368962 | A1 | 11/2023 | Phadke et al. |
| 2023/0368963 | A1 | 11/2023 | Phadke et al. |

FOREIGN PATENT DOCUMENTS

| | | |
|---|---|---|
| CN | 108492967 U | 9/2018 |
| CN | 108717902 A | 10/2018 |
| CN | 208570344 U | 3/2019 |
| CN | 109698058 A | 4/2019 |
| CN | 110233028 A | 9/2019 |
| CN | 209962853 U | 1/2020 |
| CN | 210805499 U | 6/2020 |
| CN | 112687458 A | 4/2021 |
| CN | 112700956 A | 4/2021 |
| CN | 113327751 A | 8/2021 |
| KR | 101943498 B1 | 1/2019 |
| KR | 101943499 B1 | 1/2019 |
| KR | 20200141018 A | 12/2020 |
| KR | 102250207 B1 | 5/2021 |

* cited by examiner

MANUFACTURING METHODS OF A PLANAR TRANSFORMER

CROSS REFERENCE TO RELATED APPLICATIONS

The present application is a Continuation Application of PCT Application No. PCT/CN2019/115912 filed on Nov. 6, 2019, which claims the priority of Chinese Patent Application No. 201910477789.2 filed on Jun. 3, 2019. The contents of all of the above are hereby incorporated by reference.

BACKGROUND OF THE INVENTION

1. Field of the Invention

The present application relates to a printed circuit board (PCB) of a planar transformer and a manufacturing method thereof.

2. Description of the Prior Art

Generally, a traditional transformer is a wound transformer which is formed by winding a coil on a bobbin and assembling a magnetic core or directly winding a coil on a magnetic ring. Such a product is complicated in structure, relatively large in product volume, low in cost reduction capability, high in equipment cost input, high in changeover difficulty, poor in product consistency and stability, high in potential failure risk and so on. At present, a planar transformer has been played a more important role gradually in the fields where the internal space is small, requirements on energy conservation and heat radiation are severe and requirements on weight and stability in national defense, aviation, spaceflight are higher, however, the planar transformer also has a more major defect, that is, for multi-layer stacked windings, a PCB is complicated in process and high in cost.

The disclosure of the contents in the background art is not certain to fall within the prior art of the patent application, but is only intended to help the understanding of the inventive conception and technical solutions of the present application. The background art should not be used for evaluating the novelty and creativity of the present application in the case that there is no tangible evidence to suggest that the aforementioned contents have been disclosed before the application date of the patent application.

SUMMARY OF THE INVENTION

The main purpose of the present application is to provide a PCB provided with a double-sided winding part integrally molded by colloid injection molding and capable of achieving double-sided winding at the same time by automatic winding equipment and a manufacturing method of the PCB so as to solve the problems of complicated process of the PCB and low winding efficiency caused by multi-layer stacked windings when a planar transformer is applied.

In order to achieve the aforementioned purpose, the present application adopts the following technical solutions.

A PCB of a planar transformer includes a PCB substrate and further includes a double-sided winding part formed on double sides of the PCB substrate by colloid injection molding and integrated with the PCB substrate; the PCB substrate is provided with a through hole; the double-sided winding part is of a symmetric structure on the double sides of the PCB substrate, a via hole consistent with the through hole is formed in the center of the double-sided winding part, and the via hole is aligned to the through hole to form a magnetic core hole allowing a magnetic core to pass through; the circumference of the via hole is raised to form wire blocking parts; and a wire passing groove is formed in the wall of the magnetic core hole, wherein the wire passing groove allows a metal conducting wire to pass through to be planarly wound from inside to outside on double sides of the double-sided winding part at the same time so as to form two coils in series located on the double sides of the PCB substrate.

Preferably, the wire passing groove includes a first groove located in the wall of the through hole and two second grooves located in the two wire blocking parts on the double sides of the double-sided winding part.

Preferably, the metal conducting wire includes a single-stranded copper wire or a multi-stranded copper wire.

Preferably, the through hole of the PCB substrate is selected from the group consisting of circular, elliptic, and rectangular.

Preferably, the metal conducting wire is coated with a self-adhesive layer; and during winding on the double-sided winding part, fixing while winding is achieved by heating, and thus, the coils are formed.

Preferably, each of the two coils wound on the double sides of the double-sided winding part only has a lead end on the outermost ring, and the lead ends are welded in corresponding PIN holes in the PCB substrate.

According to the aforementioned technical solutions of the present application, it is unnecessary to coat the double sides of the PCB substrate with polyimide films or other self-adhesive layers by which a self-adhesive wire can be adhered to the PCB. In this way, not only is the time of coating with the self-adhesive layers shortened, but also a series of problems, such as a phenomenon that the coated self-adhesive layers can be accumulated during winding due to a phenomenon that the self-adhesive layers can flow when being baked, are solved. By using the provided PCB of the planar transformer, the manufacturing process is shortened, the cost is reduced, influences caused by human factors are also reduced, and the percent of pass and consistency of products are guaranteed.

In order to achieve the aforementioned purpose, the present application additionally provides a manufacturing method of a PCB of a planar transformer. The manufacturing method includes: providing a PCB substrate with a through hole; performing colloid injection molding on double sides of the PCB substrate to form a double-sided winding part integrated with the PCB substrate, wherein the double-sided winding part is of a symmetric structure on the double sides of the PCB substrate, a via hole consistent with the through hole is formed in the center of the double-sided winding part, the via hole is aligned to the through hole to form a magnetic core hole allowing a magnetic core to pass through, and the circumference of the via hole is raised to form wire blocking parts; and forming a wire passing groove in the wall of the magnetic core hole, wherein the wire passing groove allows a metal conducting wire to pass through to be planarly wound from inside to outside on double sides of the double-sided winding part at the same time so as to form two coils in series located on the double sides of the PCB substrate.

Preferably, a semiautomatic CNC winding machine is adopted to enable the metal conducting wire to pass through the wire passing groove and to be wound from inside to outside on the double sides of the double-sided winding part at the same time, and after the winding is completed, obtained are two coils in series with each only having a lead end located on the outermost ring.

Preferably, the wire passing groove includes a first groove located in the wall of the through hole and two second grooves located in the two wire blocking parts on the double sides of the double-sided winding part.

Preferably, the through hole of the PCB substrate is selected from the group consisting of circular, elliptic, and rectangular.

These and other objectives of the present invention will no doubt become obvious to those of ordinary skill in the art after reading the following detailed description of the preferred embodiment that is illustrated in the various figures and drawings.

DETAILED DESCRIPTION

The present application is further described below in conjunction with the accompanying drawings and specific implementation manners.

A specific implementation manner of the present application provides a PCB of a planar transformer. The planar transformer is mainly applied to a power adapter for a fast charger of a mobile phone or a power adapter for a tablet computer and a new energy automobile. For the PCB provided by the present application, double-sided planar winding is performed by forming an integrated double-sided winding part on a PCB substrate in a colloid injection molding manner, rather than coating surfaces with self-adhesive layers, so that labor cost brought by coating with the self-adhesive layers and a series of problems brought when the self-adhesive layers are heated are avoided.

Figure 1:
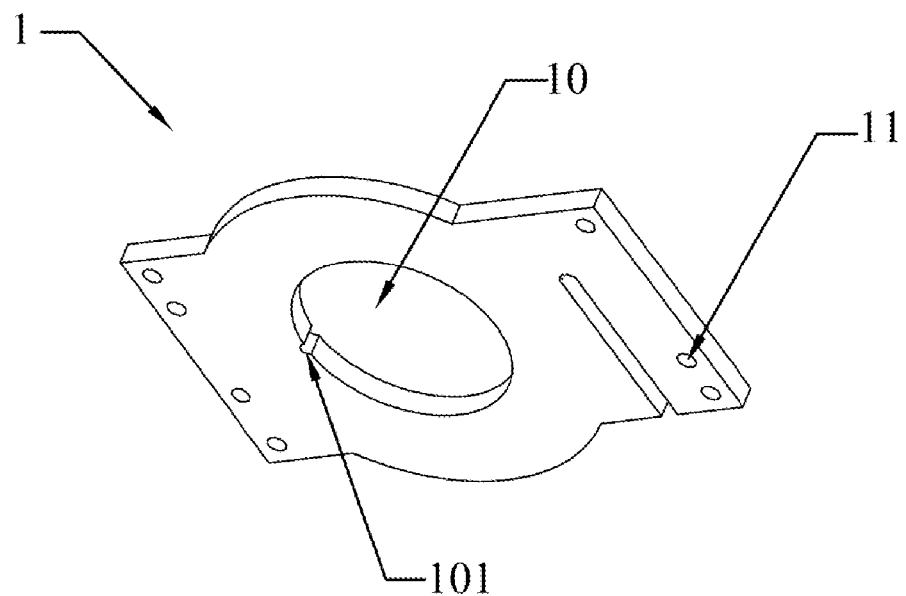
FIG. 1 is a schematic perspective view of a PCB substrate of a PCB of a planar transformer in the present application.
Figure 2:
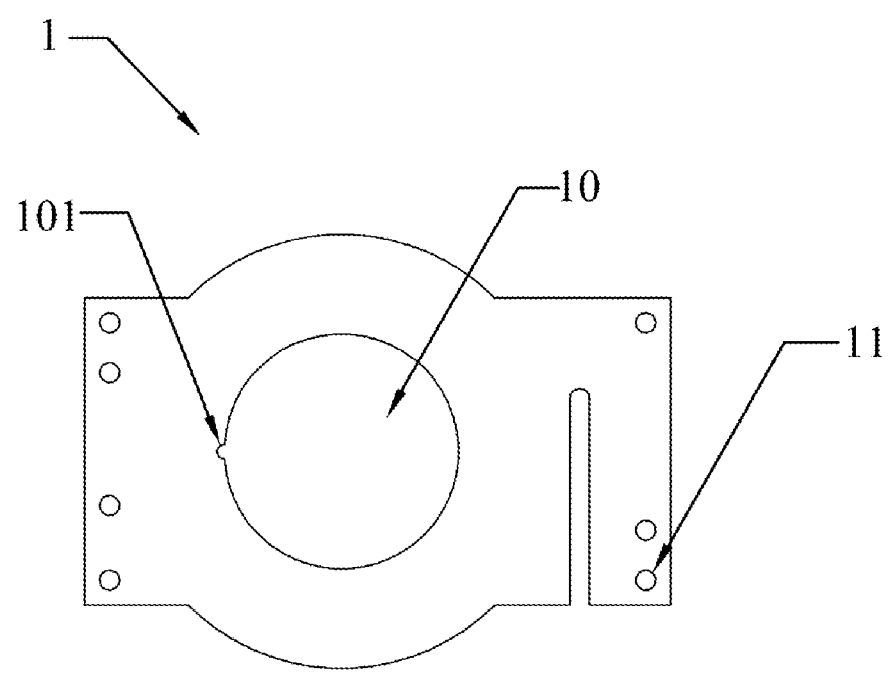
FIG. 2 is a top view of the PCB substrate as shown in FIG. 1.
Figure 3:
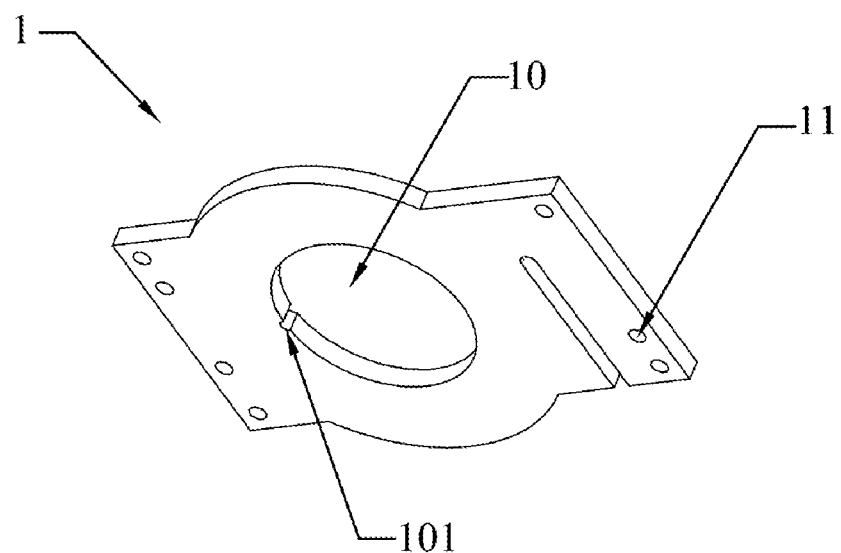
FIG. 3 is a top view of a PCB of a planar transformer in a specific embodiment of the present application.
Figure 4:
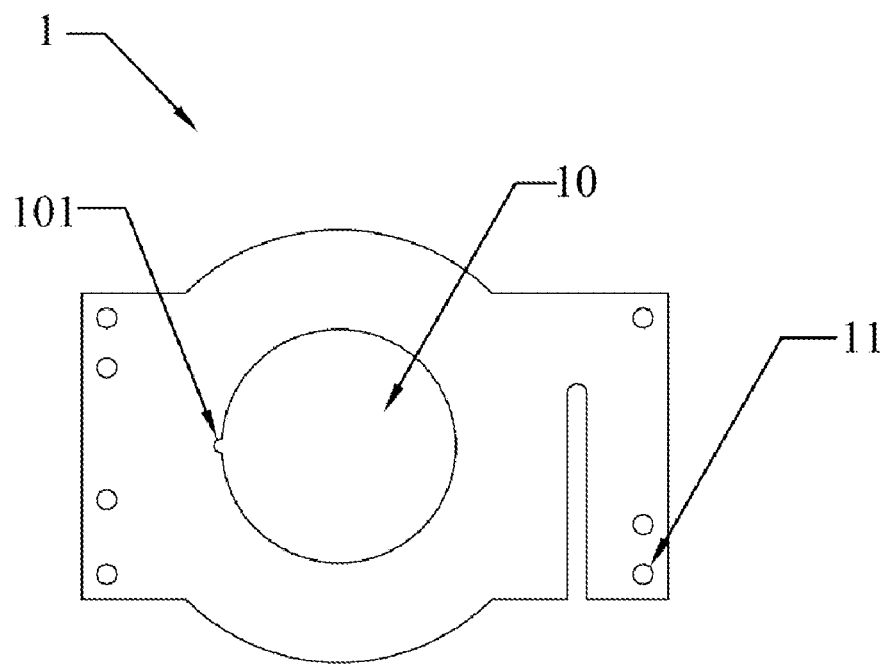
FIG. 4 is a front view of the PCB as shown in FIG. 3.
Figure 5:
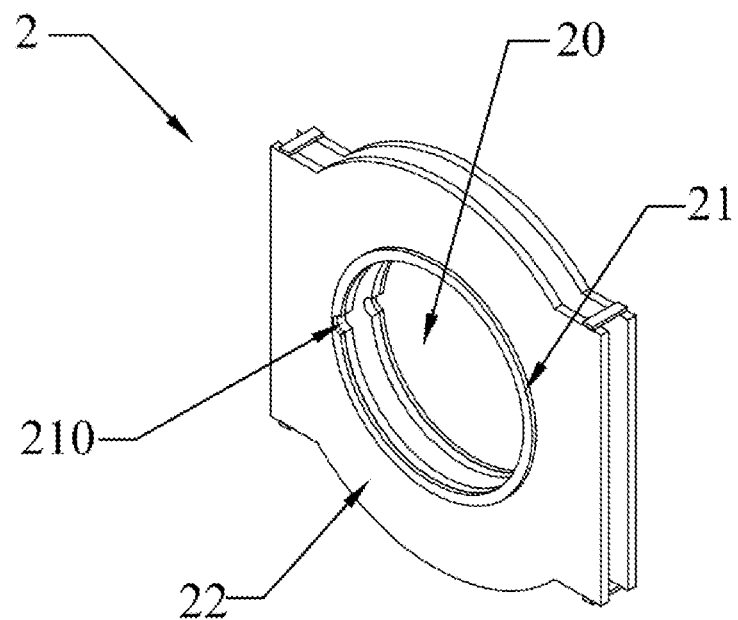
FIG. 5 is a schematic view showing a structure of a double-sided winding part on the PCB as shown in FIG. 3.
Figure 6:
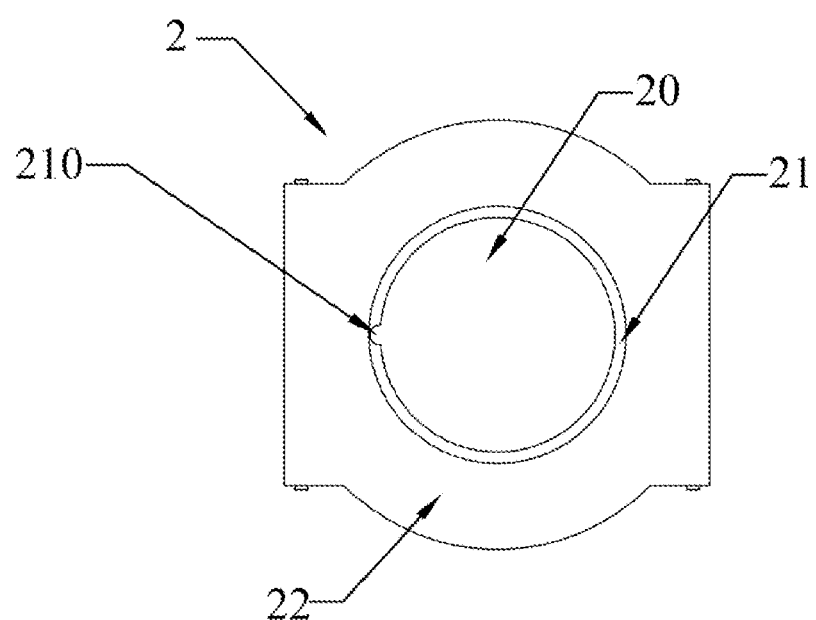
FIG. 6 is a top view of the double-sided winding part as shown in FIG. 5.
Figure 7:
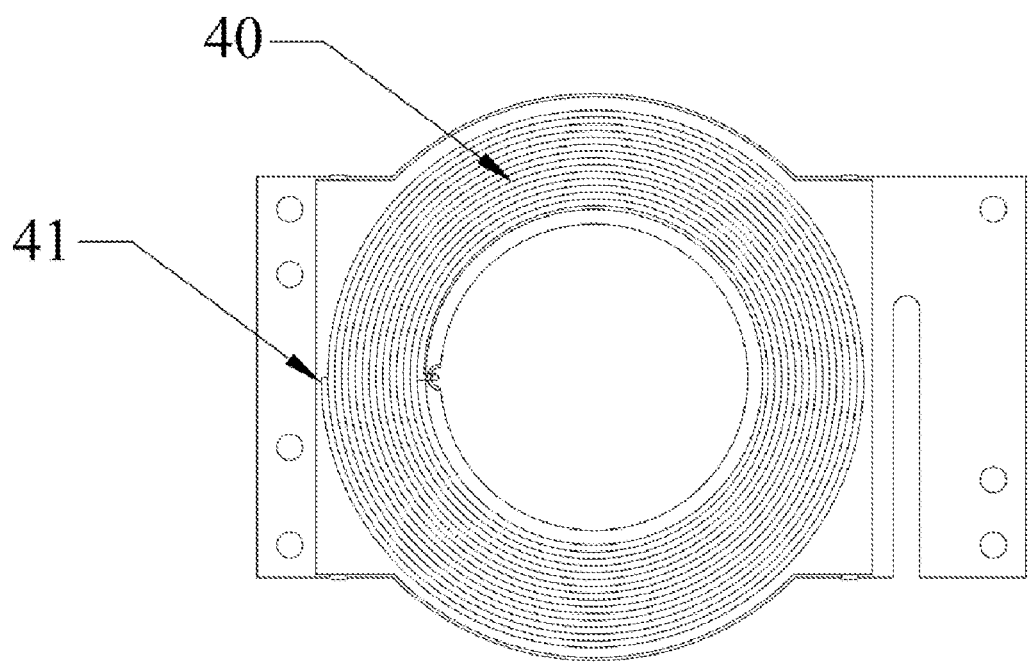
FIG. 7 is a schematic view of double-sided winding on the PCB as shown in FIG. 3.

Referring to FIG. 1 to FIG. 7, a PCB of a planar transformer in one embodiment of the present application includes a PCB substrate 1 and a double-sided winding part 2 formed on double sides of the PCB substrate by colloid injection molding and integrated with the PCB substrate. As shown in FIG. 1 and FIG. 2, the PCB substrate 1 is provided with a larger through hole 10 allowing a magnetic core of the transformer to pass through, and a first groove 101 is formed in the wall of the through hole 10; and a plurality of PIN holes 11 are formed in the circumference of the PCB substrate. As shown in FIG. 3 and FIG. 6, the double-sided winding part 2 formed by injection molding is of a symmetric structure on the double sides of the PCB substrate 1, a via hole 20 consistent with the through hole 10 is formed in the center of the double-sided winding part, and the via hole 20 is aligned to the through hole 10 to form a magnetic core hole allowing a magnetic core to pass through. Wire blocking parts 21 are formed on the raised circumference of the via hole 20, second grooves 210 are further formed in positions, corresponding to a first groove, on the two wire blocking parts 21 on the two sides, and the first groove 101 and the two second grooves 210 together form a wire passing groove 30. As shown in FIG. 7, an integral metal conducting wire is adopted to pass through the wire passing groove 30 and to be planarly wound from an inner ring to an outer ring on the double sides 22 of the double-sided winding part 2 at the same time so as to form a planar coil 40 on each side, the two planar coils 40 are connected in series, each coil only has a lead end 41 on the outermost ring (a position where winding is ended), and the lead ends 41 are welded in the corresponding PIN holes 11 in the PCB substrate.

It should be understood that the aforementioned "an integral metal conducting wire" may be a single-stranded copper wire or a conducting wire consisting of at-least-two-stranded copper wire, and "an/a" aims at emphasizing that there are only two wire ends on two ends. During winding on the PCB provided by the present application, a semiautomatic CNC winding equipment may be adopted to perform a winding, the adopted conducting wire may be a copper wire coated with a self-adhesive layer, and the winding equipment is capable of heating while winding so that the conducting wire is fixed. In addition, due to the existence of the wire blocking parts 21, when the conducting wire starts to be wound outwards from the inner ring, the innermost ring is blocked by the wire blocking parts, so that the shapes of the coils are fixed.

Figure 8:
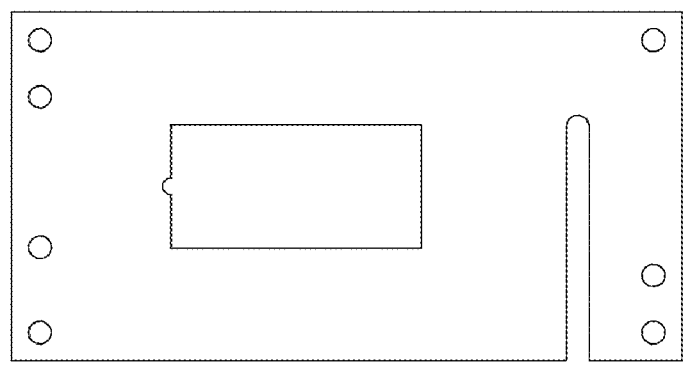
FIG. 8 and FIG. 9 are two further variants of the PCB substrate as shown in FIG. 1.
Figure 9:
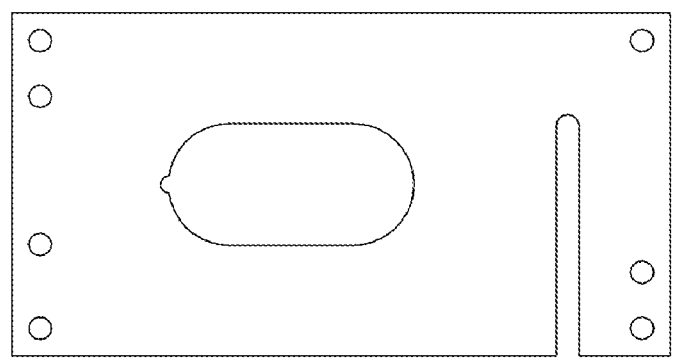

In the embodiments as shown in FIG. 1 to FIG. 7, the through hole of the PCB substrate 1 is circular, and accordingly, the via hole of the double-sided winding part 2 formed by injection molding is also circular so as to be applicable to a circular magnetic core. However, the applicable magnetic core is not limited in the present application, that is, the through hole of the PCB substrate in the present application may also be of other shapes such as a rectangle and an ellipse, as shown in FIG. 8 and FIG. 9. That is, the magnetic core hole may be of other shapes such as a rectangle and an ellipse. Accordingly, the wound coils are rectangular coils and elliptic coils.

In addition, another specific embodiment of the present application further provides a manufacturing method of a planar transformer based on the aforementioned PCB. The manufacturing method includes the following steps.

A PCB substrate with a through hole, such as the PCB substrates as shown in FIG. 1, FIG. 8 and FIG. 9, is provided. Then, colloid injection molding is performed on double sides of the PCB substrate to form a double-sided winding part integrated with the PCB substrate. Next, winding is performed, that is, an automatic winding equipment is adopted, a PCB on which a double-sided winding part has been formed is clamped on a fixture of a winding machine, a conducting wire is clamped by a chuck to pass through a magnetic core hole of the PCB and is snapped into a wire passing groove, at the moment, winding may be performed on the double sides at the same time, and after the winding is ended, lead ends are welded in corresponding PIN holes. Winding may be performed in a single-strand and single-layer manner, a single-strand and multi-layer manner, a single-layer multi-stranded wire or Liz wire juxtaposing manner and a multi-layer multi-stranded wire or Liz wire juxtaposing manner. Single-layer winding is exampled in FIG. 7. Finally, a magnetic core is mounted, and thus, the planar transformer is formed.

In preferred embodiments, the conducting wire is bent in the wire passing groove and is easily conducted to the magnetic core due to the damage of an insulating layer on the surface, and thus, a withstand voltage value of the transformer does not meet a requirement. Therefore, in the present application, when the planar transformer is manufactured, an insulating paint is coated on a position, corresponding to the wire passing groove, on the magnetic core to avoid the problem of direct conduction between the conducting wire and the magnetic core, and thus, it is ensured that the withstand voltage value of the transformer meets the requirement.

Such a transformer has the advantages of small volume and lower device height. Moreover, the volume is generally at least ¼ as small as that of a traditional wound transformer under the same power. The transformer also has various advantages such as compact structure, firmness, high reliability, high consistency, winding alignment, small leakage inductance and low radiated interference of EMI.

In addition, the overall process is automatically completed by the winding machine, so that the time of the process is shortened, influences caused by human factors are reduced, and accordingly, the percent of pass and consistency of products will be better guaranteed.

The aforementioned contents are further detailed descriptions of the present application in conjunction with the specific preferred implementation manners, but cannot affirm that the specific implementation of the present application is only limited to these descriptions. The skilled in the art to which the present application belongs may further make several equivalent replacements or obvious modifications without departing from the concept of the present application, and those of which the performances or applications are the same should be regarded to fall within the protective scope of the present application.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A manufacturing method of a PCB of a planar transformer, comprising:
providing a PCB substrate with a through hole;
performing colloid injection molding on double sides of the PCB substrate to form a double-sided winding part integrated with the PCB substrate, wherein the double-sided winding part is of a symmetric structure on the double sides of the PCB substrate, a via hole consistent with the through hole is formed in the center of the double-sided winding part, the via hole is aligned to the through hole to form a magnetic core hole allowing a magnetic core to pass through, and the circumference of the via hole is raised to form wire blocking parts; and
forming a wire passing groove in a wall of the magnetic core hole, wherein the wire passing groove allows a metal conducting wire to pass through to be planarly wound from inside to outside on double sides of the double-sided winding part at the same time so as to form two coils in series located on the double sides of the PCB substrate.

2. The manufacturing method of claim 1, wherein a semiautomatic CNC winding machine is adopted to enable the metal conducting wire to pass through the wire passing groove and to be wound from inside to outside on the double sides of the double-sided winding part at the same time, and after the winding is completed, obtained are two coils in series with each only having a lead end located on an outermost ring.

3. The manufacturing method of claim 1, wherein the wire passing groove comprises a first groove located in the wall of the through hole and two second grooves located in the two wire blocking parts on the double sides of the double-sided winding part.

4. The manufacturing method of claim 1, wherein the through hole of the PCB substrate is selected from the group consisting of circular, elliptic, and rectangular.

5. A method of manufacturing a planar transformer, the method comprising:
forming a double-sided winding integrated with a PCB substrate, wherein the double-sided winding is symmetric on both sides of the PCB substrate and circumferential about a through hole in the PCB substrate;
passing a wire through a wire passing groove in the PCB substrate; and
planarly winding the wire from inside to outside on both sides of the double-sided winding to form two coils in series, one located on each side of the PCB substrate.

6. The method of claim 5 wherein winding the wire from inside to outside on both sides of the double-sided winding is performed at the same time.

7. The method of claim 6 wherein winding the wire is performed using a semiautomatic CNC winding machine.

8. The method of claim 5 wherein the two coils in series, one located on each side of the PCB substrate, each having a lead end located on an outermost ring.

9. The method of claim 5 further comprising forming a via hole aligned with the through hole to form a magnetic core hole allowing a magnetic core to pass through the PCB substrate.

10. The method of claim 9 further comprising mounting the magnetic core passing through the PCB substrate.

11. The method of claim 9 wherein a circumference of the via hole is raised to form one or more wire blocking parts.

12. The manufacturing method of claim 11, wherein the wire passing groove comprises a first groove located in the wall of the through hole and two second grooves located in the two wire blocking parts on the double sides of the double-sided winding part.

13. The manufacturing method of claim 5 wherein the wire passing groove comprises a first groove located in the wall of the through hole.

14. The manufacturing method of claim 5 wherein forming a double-sided winding integrated with a PCB substrate comprises colloid injection molding of the double-sided winding.

15. A method of manufacturing a planar transformer, the method comprising:
providing a PCB substrate having a printed circuit winding formed thereon, wherein the winding is circumferential about a through hole in the PCB substrate;
passing a wire through a wire passing groove in the PCB substrate; and
planarly winding the wire from inside to outside on both sides of the PCB substrate to form two coils in series, one located on each side of the PCB substrate; and
mounting a magnetic core passing through the PCB substrate.

16. The method of claim 15 wherein winding the wire from inside to outside on both sides of the double-sided winding is performed at the same time.

17. The method of claim 15 wherein the two coils in series, one located on each side of the PCB substrate, each having a lead end located on an outermost ring.

18. The method of claim 15 wherein the magnetic core passes through the PCB substrate through a via hole aligned with the through hole.

19. The method of claim 18 wherein a circumference of the via hole is raised to form one or more wire blocking parts.

20. The manufacturing method of claim 15, wherein the wire passing groove comprises a first groove located in the wall of the through hole.

\* \* \* \* \*